(12) United States Patent
Nakabayashi et al.

(10) Patent No.: US 6,475,278 B2
(45) Date of Patent: Nov. 5, 2002

(54) MOLECULAR BEAM SOURCE AND MOLECULAR BEAM EPITAXY APPARATUS

(75) Inventors: Takaya Nakabayashi, Mie; Shuji Makino, Nara, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/773,571

(22) Filed: Feb. 2, 2001

(65) Prior Publication Data

US 2001/0010203 A1 Aug. 2, 2001

(30) Foreign Application Priority Data

Feb. 2, 2000 (JP) .................................... 2000-025445

(51) Int. Cl.$^7$ ............................................. C30B 35/00
(52) U.S. Cl. ..................... 117/200; 117/108; 117/900
(58) Field of Search ............................. 117/108, 200, 117/900

(56) References Cited

U.S. PATENT DOCUMENTS 4,748,315 A * 5/1988 Takahashi et al. ........... 219/275

FOREIGN PATENT DOCUMENTS

| JP | A63282189 | 11/1988 |
| JP | A1153595 | 6/1989 |
| JP | A230693 | 1/1990 |
| JP | A4274316 | 9/1992 |
| JP | A585888 | 6/1993 |
| JP | A722314 | 1/1995 |
| JP | A097948 | 10/1997 |
| JP | A11299915 | 2/1999 |
| JP | A11504613 | 4/1999 |

* cited by examiner

Primary Examiner—Felisa Hiteshew

(57) ABSTRACT

A molecular beam source comprising a crucible having an opening, and a heater mounted to the crucible for evaporating by heating a molecular beam generating material accommodated in the crucible to emit a molecular beam from the opening, wherein the crucible has an accommodating section for accommodating the molecular beam generating material, a bent portion provided between the opening and the accommodating section so that the molecular beam generating material accommodated in the accommodating section does not face the opening directly, and a narrowed portion between the bent portion and the opening.

7 Claims, 7 Drawing Sheets

MOLECULAR BEAM SOURCE AND MOLECULAR BEAM EPITAXY APPARATUS

CROSS-REFERENCE TO RELATED APPLICATION

This application is related to Japanese Patent Application No. 2000-025445 filed on Feb. 2, 2000, whose priority is claimed under 35 USC §119, the disclosure of which is incorporated by reference in its entirety.

BACKGROUND OF THE INVENTION

1. Field of the Invention

The present invention relates to a molecular beam source and a molecular beam epitaxy apparatus, more particularly, to a molecular beam source for accommodating a molecular beam generating material therein and thermally evaporating or subliming the material to generate a molecular beam in a molecular beam epitaxy (referred to as MBE hereinafter) technique and a molecular beam epitaxy apparatus using the molecular beam source.

2. Description of Related Art

The MBE technique is a technique for generating a molecular beam by evaporating or subliming a high purity material and growing crystals on a GaAs substrate or the like in a high vacuum. It is generally used for forming semiconductor thin films of compound semiconductor devices such as semiconductor lasers and is now under research and development for further improvement.

In the MBE technique, to reduce impurities remaining in a vacuum chamber is important in production of semiconductor thin films. For this purpose, exhausters have been improved and chamber baking has been implemented in order to obtain good semiconductor thin films.

However, substances adhering to sites other than a substrate such as a shroud (a cryo panel) and the like during discharge of gasified materials and/or during crystal growth come off and fall in a molecular beam source (also referred to as "molecular beam source cell" or simply "cell") when liquid nitrogen is removed from the shroud. The fallen substances are re-evaporated at the next growth of crystals and result in increase of residual impurities in the vacuum chamber and a possible decline in the quality of semiconductor thin films. The re-evaporated substances may also enter a heater for heating the material mounted to a crucible of the molecular beam source cell and a lead line of a thermocouple for measuring temperature and cause troubles such as insulation failure.

To cope with this, measures have been taken such as inclining the vacuum chamber for preventing substances adhering to the shroud around the substrate and the like from falling into the cell even if they come off. Typically, the cell has a crucible in which a molecular beam generating material is fed and a heater disposed to surround the crucible almost entirely for evaporating the molecular beam generating material fed in the crucible.

With this construction, however, cells attached to upper ports of the vacuum chamber are inclined more.

Accordingly, if crucibles 901 and 902 of conventional structures shown in FIG. 11 and FIG. 12 are used, the crucibles 901 and 902 can only accommodate a decreased amount of the molecular beam generating material. As a result, the molecular beam generating material is required to be fed an increased number of times, which results in an increase in the number of maintenance operations, a decline in the availability of the MBE apparatus and an increase in production costs.

If the chamber is further inclined and the cell is mounted to the port at an angle such that an inlet opening of the cell faces toward a direction lower than a horizontal line, the crucibles 901 and 902 of the conventional structures shown in FIG. 11 and 12 cannot be used for a melt-type molecular beam generating material but can be used only for a sublime-type solid molecular beam generating material.

Published Japanese Translation of PCT International Publication for Patent Application No. HEI 11(1999)-504613 discloses a unibody crucible 903 having a negative draft orifice 904 as shown in FIG. 13. With this construction, even if the cell is horizontally laid, the melt-type molecular beam generating material can be used.

Another conventional structure for a crucible is shown in FIG. 14. The crucible 910 is comprised of a molecular beam generating material accommodating section 913, a molecular beam shape defining section 912, and a bent portion 908 formed therebetween, as shown in FIG. 14. The crucible 910 has a structure such that the molecular beam generating material accommodated in the molecular beam generating material accommodating section 913 does not face an opening 905 directly, that is, the molecular beam generating material accommodated in the molecular beam generating material accommodating section 913 cannot be seen from the opening 905.

In the above mentioned crucibles 901 and 902, if the chamber is inclined for preventing substances adhering to the shroud or the like from falling into the crucible, the amount of the molecular beam generating material that can be fed in the crucible (i.e., the capacity of the crucible) becomes smaller in a cell attached to an upper port. The number of maintenance operations for feeding the material increases, the machine operating time decreases and the production costs increase.

Also, there is a problem in that the melt-type molecular beam generating material cannot be used at a port which causes the opening of the cell to face in a downward direction.

Further, if the cell is set substantially horizontally using the crucible 903 of the conventional structure shown in FIG. 13, an evaporation area of the molecular beam generating material changes and the intensity of the molecular beam changes as the molecular beam generating material is consumed and the liquid level of the material drops. Usually, the molecular beam intensity is measured at regular intervals and compensated by adjusting the temperature of the heater. With a crucible having a structure such that the evaporation area of the molecular beam generating material is liable to change, the measurement and compensation of the molecular beam intensity must be carried out more often, which results in a decrease in the availability of the apparatus and an increase in the production costs.

Further, if the crucible 910 having the structure shown in FIG. 14 is used and the molecular beam shape defining section 912 is positioned substantially horizontally, the molecular beam intensity does not change owing to a drop in the liquid level of the molecular beam generating material, but, in order to increase the feed amount of the molecular beam generating material, the bent portion 908 of the crucible 910 need to be located at a position farther from a substrate than a cell port flange of the vacuum chamber so as to avoid contact with an outer surface of the vacuum chamber. Accordingly, if the opening 905 of the crucible 910 is set at the same position as an opening of a conventional cell, the distance from a bent portion 908 of the crucible 910 to the opening 905 becomes longer and a thinner molecular beam is emitted from the opening 905 of the crucible 910. For this reason, the crucible 910 of the above-described structure is suitable for laboratory-scale MBE apparatuses for small substrates, while it cannot provide a uniform film thickness in industrial-scale MBE apparatus for large substrates.

SUMMARY OF THE INVENTION

In view of the above-described circumstances, an object of the present invention is to provide a molecular beam source which is capable of accommodating a large amount of the molecular beam generating material and also provides a uniform film thickness on a large substrate and a molecular beam epitaxy apparatus using the molecular beam source.

The present invention provides a molecular beam source comprising a crucible having an opening, and a heater mounted to the crucible for evaporating by heating a molecular beam generating material accommodated in the crucible to emit a molecular beam from the opening, wherein the crucible has an accommodating section for accommodating the molecular beam generating material; a bent portion provided between the opening and the accommodating section so that the molecular beam generating material accommodated in the accommodating section does not face the opening directly; and a narrowed portion between the bent portion and the opening.

The molecular beam source according to the present invention is provided with the crucible which is so bent that the molecular beam generating material accommodated therein does not face the opening directly, i.e., that the molecular beam generating material accommodated in a bottom portion of the crucible is not seen from the opening, and which has, between the bent portion and the opening, the narrowed portion whose cross-sectional area is reduced. Therefore, the molecular beam source has the following advantages: It is applicable for a melt-type molecular beam generating material; the molecular beam generating material is prevented from scattering toward the opening even if it boils suddenly; and it is ensured that the molecular beam generating material is fed in a sufficient amount and also the molecular beam emitted from the opening of the crucible can diffuse radially, and therefore, a uniform film thickness can be obtained on a large substrate.

In the molecular beam source of the present invention, if the crucible is comprised of an accommodating section from the bent portion to the bottom portion in which the molecular beam generating material is accommodated and a molecular beam shape defining section from the bent portion to the opening of the crucible, the narrowed portion may be formed at least at one site in the molecular beam shape defining section.

As a particular shape of the molecular beam source of the present invention, the crucible may be in a tubular shape having an inside wall parallel to the direction of its axis throughout its length, preferably in a cylindrical shape having a constant inner diameter, the central axis of the accommodating section and that of the molecular beam shape defining section are in the same plane, and these central axes form an angle of 30° to 150°.

The accommodating section is preferably in such a shape that the evaporation area of the molecular beam generating material does not change if the amount of the molecular beam generating material changes.

The narrowed portion preferably has an inner diameter which is 1/20 to 1/2 of the maximum inner diameter from the bent portion to the opening.

If the shape from the narrowed portion to the opening is substantially conic, molecular beams can be generated from the central axis of the molecular beam shape defining section regularly in radial directions.

If the crucible is constructed to have at least two components which are connectable at a position nearer to the bent portion than to the narrowed portion, the crucible can be divided, for example, into the accommodating section formed of a tube having a constant diameter and the molecular beam shape defining section having the narrowed portion. Accordingly, the crucible may have a complicated shape and the degree of freedom in determining the shape of the crucible increases. Also the molecular beam generating material is fed in the accommodating section more easily.

If the components of the crucible are constructed to be connected to each other by a friction fit, it facilitates the separation and connection of the components at a joint.

In the present invention, the molecular beam source may preferably be provided with at least two sets of heaters whose temperatures are separately controlled. Further, if a heater disposed at the molecular beam shape defining section is so arranged that a part of the heater disposed from the opening to the narrowed portion of the crucible is denser than a part of the heater disposed in other region of the molecular beam shape defining section, the material can be prevented from adhering to the opening of the crucible where the temperature would otherwise be liable to drop.

In another aspect of the present invention, there is provided a molecular beam epitaxy apparatus comprising a molecular beam source; a vacuum chamber for supporting the molecular beam source; a shroud provided along an inner wall of the vacuum chamber; and a substrate holder provided in the shroud opposedly to the opening of the crucible of the molecular beam The molecular beam epitaxy apparatus of the present invention may be provided with a plurality of molecular beam sources.

These and other objects of the resent application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

The molecular beam source and molecular beam epitaxy of the present invention are now described by way of examples with reference to the attached drawings. These examples, however, should not be construed to limit the scope of the invention.

EXAMPLE 1

Figure 1:
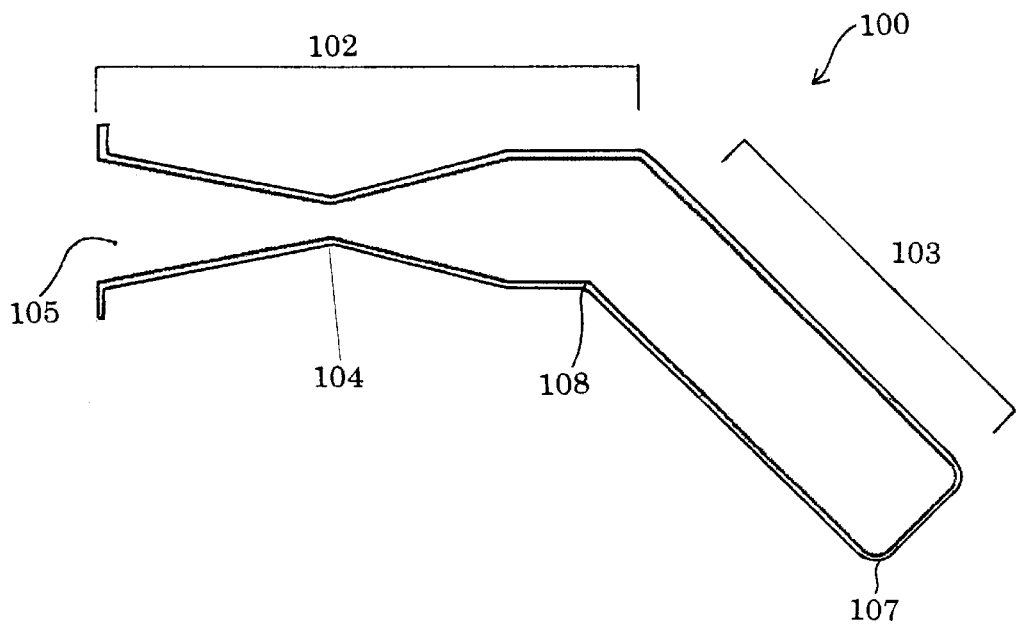
FIG. 1 is a schematic sectional view illustrating the construction of an example of a crucible used in a molecular beam source in accordance with the present invention.

FIG. 1 shows an example of a crucible of a molecular beam source in accordance with the present invention.

In FIG. 1, a crucible 100 is a one-piece structure of pyrolytic boron nitride (pBN). It is bent at an almost central part so that a molecular beam generating material accommodated in a bottom portion 107 is not seen from an opening 105 and it also has a narrowed portion 104 whose cross-sectional area is reduced, between a bent portion 108 and the opening 105.

If the section from the bent portion 108 to the bottom in which the molecular beam generating material is accommodated is referred to as a material accommodating section 103 and the section from the bent portion 108 to the opening 105 is referred to as a molecular beam shape defining section 102, the maximum inner diameter of the molecular beam shape defining section 102 is 60 mm and the inner diameter of the narrowed portion 104 is 16 mm. The molecular beam shape defining section 102 has substantially conical shapes in front and rear of the narrowed portion 104. The material accommodation section 103 is substantially cylindrical. The material accommodation section 103 and the molecular beam shape defining section 102 form a bend angle of 135°.

Figure 2:
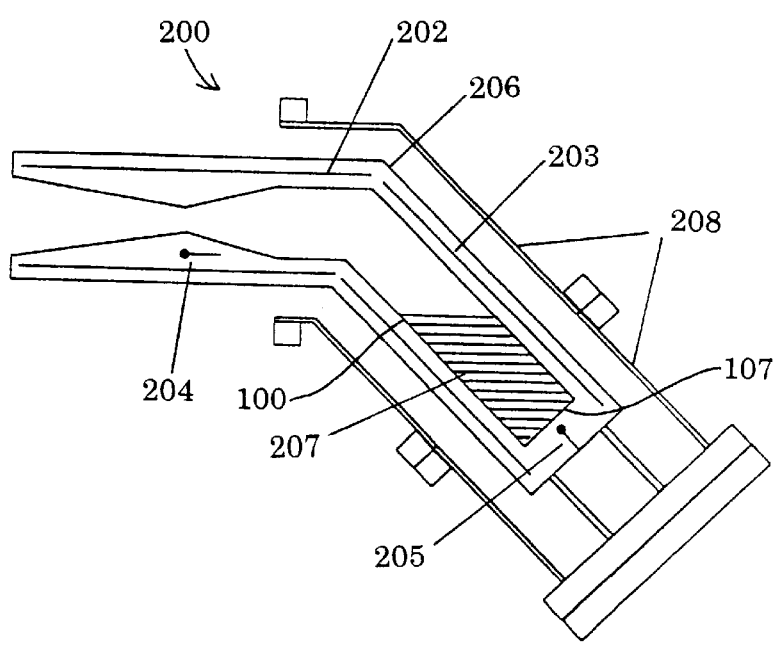
FIG. 2 is a schematic sectional view illustrating the construction of an example of a molecular beam source using the crucible of FIG. 1 in accordance with the present invention.

FIG. 2 shows an example of a molecular beam source using the above-described crucible 100 in accordance with the present invention.

In FIG. 2, a molecular beam source cell 200 (corresponding to the molecular beam source of the present invention) is provided with the above-described crucible 100 for accommodating a molecular beam generating material 207 (e.g., gallium), heaters 202 and 203, thermocouples 204 and 205 and a nipple 208. The heaters 202 and 203 are resistance heating elements independently disposed helically to cover almost all of the molecular beam shape defining section 102 and the material accommodating section 103, respectively (in the figure they are shown like plates for simplicity). Of these heaters 202 and 203, the heater 202 of the molecular beam shape defining section 102 is arranged to have closer intervals (arrangement density of the resistance heating element) in the vicinity of the opening than in other regions.

The thermocouple 204, which measures the temperature of the molecular beam shape defining section 102, is located in the vicinity of the narrowed portion 104 of the crucible 100, and the thermocouple 205, which measures the temperature of the material accommodating section 103, is located in the vicinity of the bottom portion 107 of the material accommodating section 103 of the crucible 100.

The heaters 202 and 203 are controlled on the basis of measurement results obtained by the thermocouples 204 and 205 so that the heater 202 of the molecular beam shape defining section 102 has a higher temperature than the heater 203 of the material accommodating section 103.

The nipple 208 is formed of a cylindrical pipe bent at the same bend angle of 135° as the bend angle of the crucible 100. It has a structure allowing its halfway division into two parts for facilitating its assembly. The nipple is attached to an MBE apparatus described later to cover a reflection plate 206 and the crucible 100 and maintain vacuum around the crucible 100. A water cooling jacket (not shown) is disposed outside the nipple 208.

Figure 3:
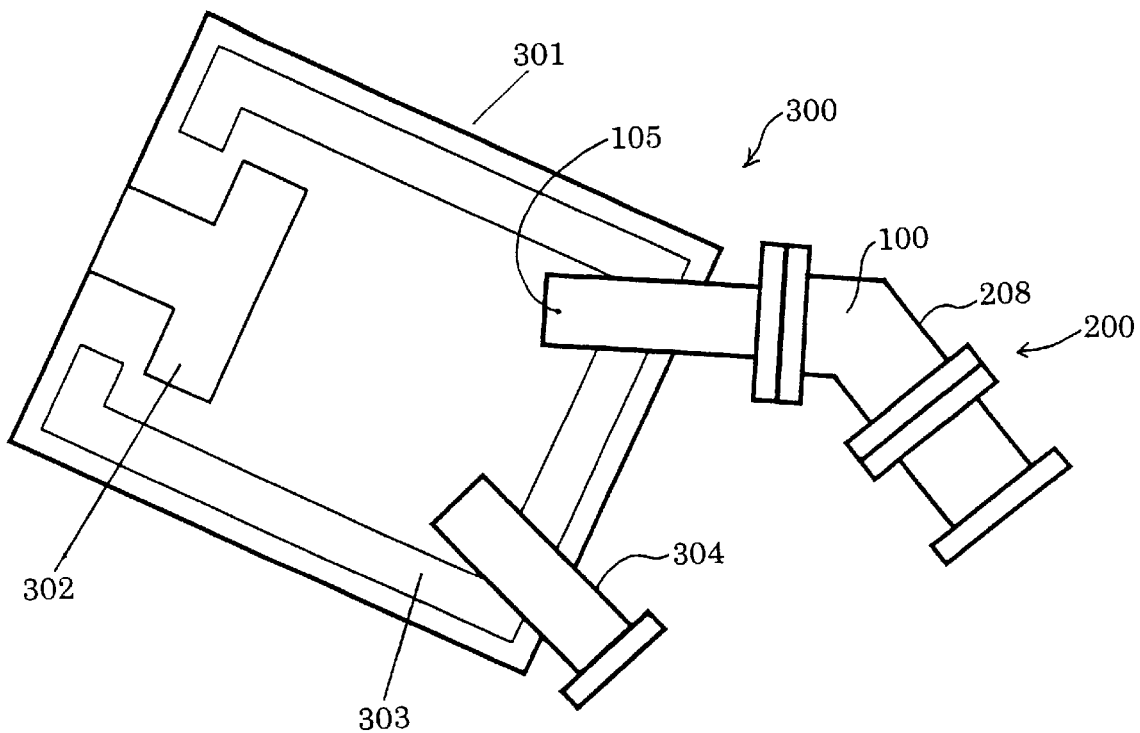
FIG. 3 is a schematic sectional view illustrating the construction of an MBE apparatus using the molecular beam source of FIG. 2 in accordance with the present invention.

FIG. 3 shows an MBE apparatus using the above-described molecular beam source 200. The MBE apparatus is for forming semiconductor thin films.

In FIG. 3, an MBE apparatus 300 is provided with a vacuum chamber 301, a molecular beam source cell 200 having an opening within the vacuum chamber 301, a substrate holder 302 provided with a substrate rotating and heating mechanism, a shroud 303 and another cell port 304. The opening 104 of the crucible 100 of the molecular beam source cell 200 faces the center of the substrate holder 302. The molecular beams are set to be incident at an angle of 36° with respect to the normal line of the substrate holder 302. In this example, a rotating shaft of the substrate holder 302 is set inclinedly at an angle of 54° to the vertical.

The molecular beam source cell 200 is attached to a horizontal port of the MBE apparatus 300 and is capable of accommodating about 250 cc of a molten molecular beam generating material.

In Example 1, the heaters 202 and 203 are disposed so as to cover the crucible 100 almost entirely. If the crucible 100 has a low temperature site, the molecular beam generating material does not re-evaporate and adheres to the low temperature site in the crucible 100. The above-mentioned cover-all disposition of the heaters 202 and 203 is for avoiding that.

Further, the heater 202 of the molecular beam shape defining section 102 of the crucible 102 is arranged to be twice as dense in a part of the heater from the opening 105 to the narrowed portion 104 than in a part of the heater from the narrowed portion 104 to the bent portion 108. This is because, if the density of the heater in the vicinity of the opening 105 is equal to that in other parts, the temperature at the opening 105 is more liable to drop than that at other parts of the crucible 100.

In the molecular beam source 200, almost all high-temperature components such as the heaters 202 and 203 are not covered separately with shrouds as in conventional sources. Accordingly, the cell port, nipple 208 and others of the MBE apparatus 300 are heated easily. If the nipple 208 is heated, it affects the degree of vacuum. Therefore, it is preferable to set a water cooling jacket (not shown) outside the vacuum chamber 301 which is in a vacuum atmosphere so that the temperature of a horizontal port and the nipple site 208 does not rise.

According to this example, a film of uniform thickness can be obtained over the entire surface of a large-scale substrate by forming a conical portion from the narrowed portion 104 to the opening 105 of crucible 100. In this example, the inner diameter of the narrowed portion of the crucible 100 is set to about one-fourth of the maximum inner diameter of the molecular beam shape defining section 102. However, a similar effect can be obtained if the inner diameter of the narrowed portion is within the range of ¹⁄₂₀ to ½ of the maximum inner diameter.

In this example, the angle formed by the molecular beam shape defining section 102 and the material accommodating section 103 of the crucible 100 is set to 135°. However, a similar effect can be obtained if the angle is within the range of 30° to 150°.

Thus, since not only a solid molecular beam generating material but also a molten molecular beam generating material can be fed into the molecular beam source cell 200 using the crucible 100, the feed amount of the molecular beam generating material is larger as compared with the case of molecular beam source cells of conventional structures. Therefore, it is possible to prolong a feeding cycle of the molecular beam generating material.

Figure 13:
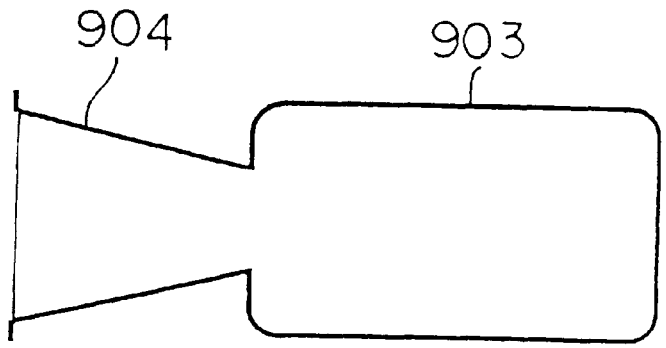
FIG. 13 is a schematic sectional view illustrating the construction of a conventional crucible having an orifice.

For example, a crucible 903 of a conventional structure shown in FIG. 13, if attached to a horizontal cell port, can accommodate about 20 cc of the molten molecular beam generating material, while the molecular beam source cell 200 of Example 1, if attached to a horizontal cell port, can accommodate about 200 cc of the molten molecular beam generating material, which is about ten times as large as the material which can be accommodated in the crucible 903 of the conventional structure. Therefore, the material feeding cycle can be extended five times or more, and product costs can be reduced to ⅔ or less.

Furthermore, with the crucible 903 of the conventional structure, as the molecular beam generating material is consumed and the liquid level drops, the evaporation area decreases, and if the temperature of the heater is constant, flux intensity decreases. Therefore, in order to keep constant the flux intensity, the temperature of the heater needs to be compensated at all times. Usually, this compensation of the temperature of the heater needs to be carried out after crystal growth is performed on a substrate several times. However, with the molecular beam source cell 200 of this example, the evaporation area does not change with the consumption of the molecular beam generating material until the liquid level drops to the vicinity of the bottom. Therefore, even if the temperature of the heater is constant, the flux intensity can be kept almost constant. For this reason, a constant flux intensity can be achieved by compensating the temperature of the heater at longer intervals, and therefore, the availability of the MBE apparatus 300 can be improved.

Figure 11:
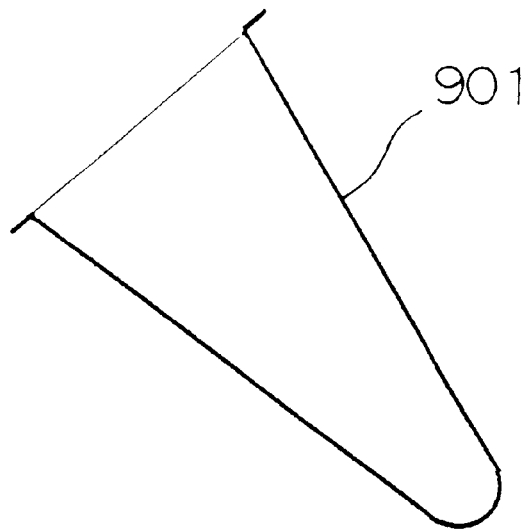
FIG. 11 is a schematic sectional view illustrating the construction of a conventional conical crucible.
Figure 12:
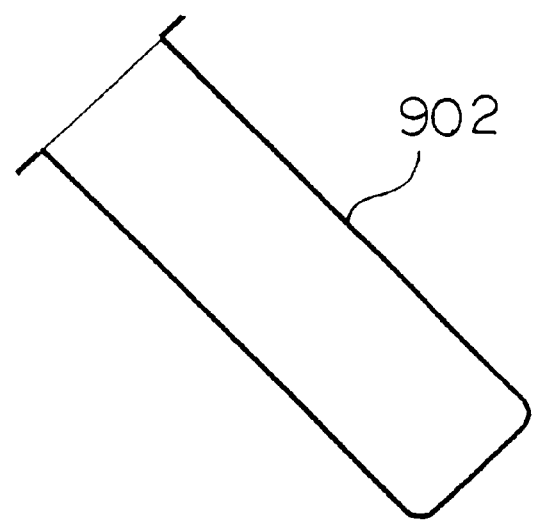
FIG. 12 is a schematic sectional view illustrating the construction of a conventional cylindrical crucible.

Furthermore, with the crucibles 901, 902 and 903 of the conventional structures shown in FIG. 11, FIG. 12 and FIG. 13, since the molecular beam generating material is seen from their openings, sudden boiling of the molecular beam generating material easily causes defects on a substrate on which epitaxial growth progresses. With the crucible 100 of Example 1, the molecular beam generating material, if it boils suddenly, does not reach directly the substrate held by the substrate holder 302. Thus defects on the surface of the substrate decreases significantly.

Furthermore, the molecular beam source cell 200 can be arranged so that the opening 105 of the crucible 100 faces in a direction lower than the horizontal. Accordingly, a substance adhering to the shroud 303, even if it falls, does not drop in the molecular beam generating material cell 200. Therefore, can be prevented the decline of the reliability of the molecular beam source cell 200 owing to insulation failure of the heaters 202 and 203 and the thermocouples 204 and 205. Also can be prevented the deterioration of the quality of the semiconductor thin film owing to the substance adhering to the shroud 303 dropping in the crucible 100 during the formation of the film.

EXAMPLE 2

Figure 4:
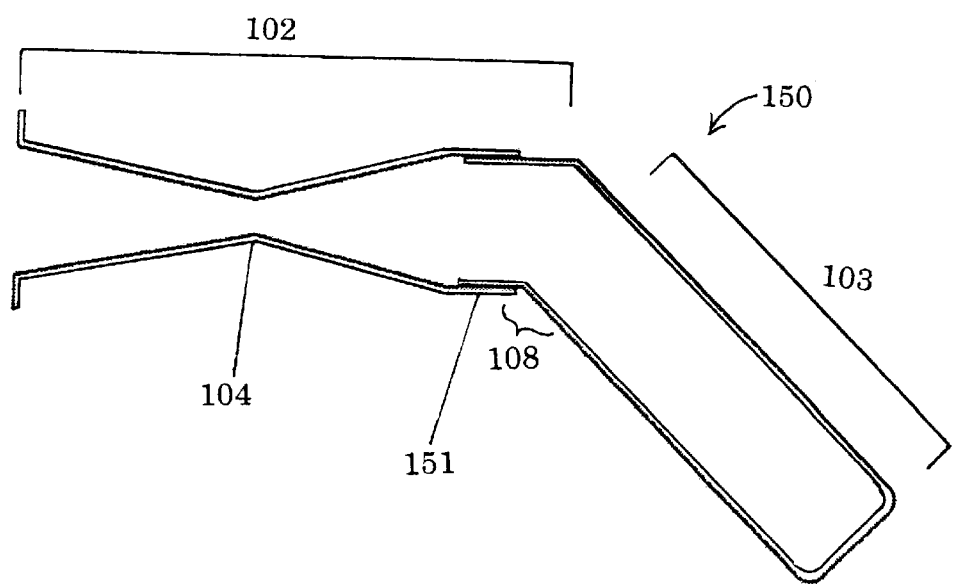
FIG. 4 is a schematic sectional view illustrating the construction of another example of a crucible used in a molecular beam source in accordance with the present invention.

FIG. 4 shows an example of a crucible of a molecular beam source in accordance with the present invention.

In FIG. 4, a crucible 150 has almost the same shape as the crucible 100 of Example 1 but is different from the crucible 100 in that it has a joint 151 in the vicinity of a bent portion 108. That is, the crucible 150 is comprised of a material accommodating section 103 including the bent portion 108 and a molecular beam shape defining section 102. The joint 151 is constructed to be located in a parallel cylindrical part between a narrowed portion 104 and the bent portion 108 and connect the above-mentioned two sections by the friction fit.

Figure 5:
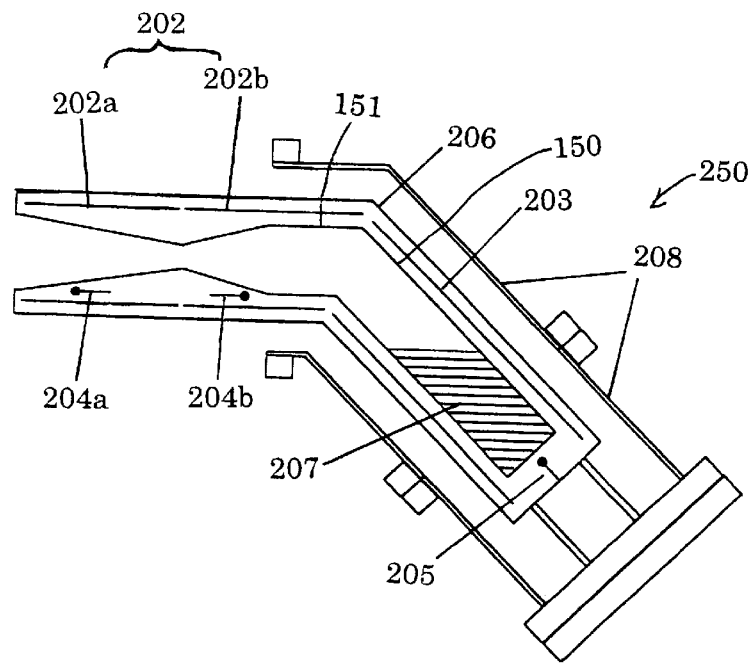
FIG. 5 is a schematic sectional view illustrating the construction of an example of a molecular beam source using the crucible of FIG. 4 in accordance with the present invention.

FIG. 5 shows an example of a molecular beam source using the above-described crucible 150 in accordance with the present invention.

In FIG. 5, a molecular beam source cell 250 (corresponding to the molecular beam source of the present invention) has almost the same shape as the molecular beam source cell 200 of Example 1 but is different from the molecular beam source cell 200 in that a heater 202 covering the molecular beam shape defining section 102 is capable of being divided into two at the narrowed portion 104 as a boundary. That is, the heater 202 is comprised of separate heaters 202a and 202b, and thermocouples 204a and 204b are mounted on the heaters 202a and 202b, respectively.

Figure 6:
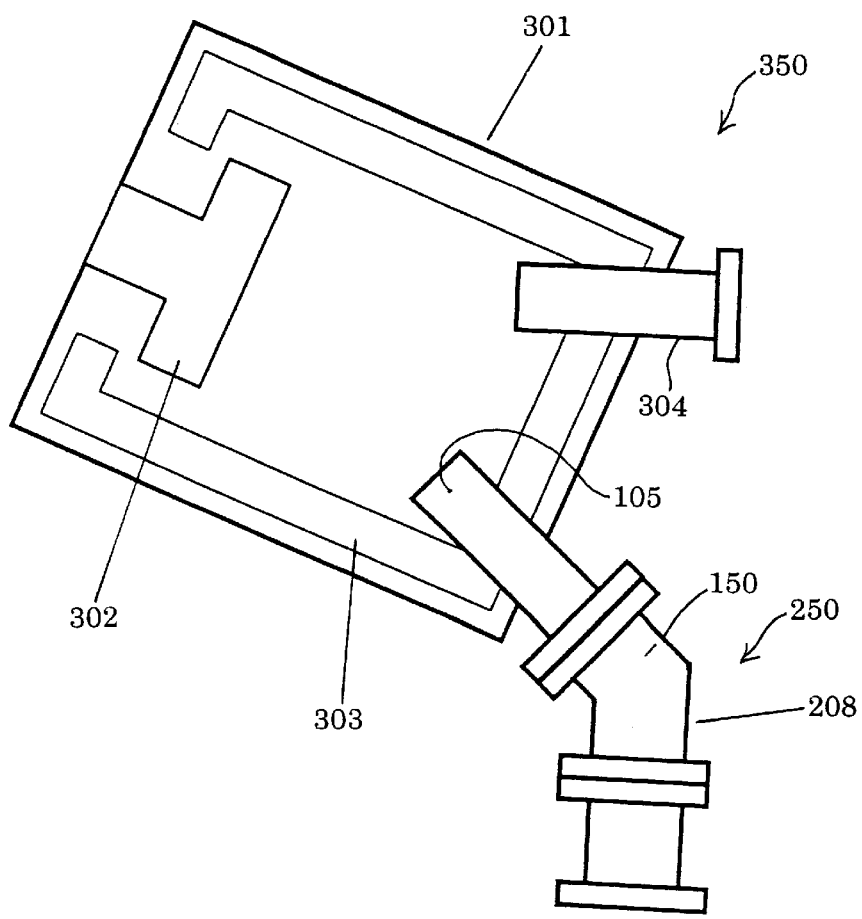
FIG. 6 is a schematic sectional view illustrating the construction of an MBE apparatus using the molecular beam source of FIG. 5 in accordance with the present invention.

FIG. 6 shows an MBE apparatus using the above-described molecular beam source 250.

In FIG. 6, an MBE apparatus 350 is provided with a vacuum chamber 301, the molecular beam source cell 250 having an opening within the vacuum chamber 301, a substrate holder 302 provided with a substrate rotating and heating mechanism, a shroud 303 and another cell port 304. The opening 105 of the crucible 150 of the molecular beam source cell 250 faces the center of the substrate holder 302. The molecular beams are set to be incident at an angle of 25° with respect to the normal line of the substrate holder 302. The molecular beam source cell is attached to a cell port inclined at an angle of 40° with respect to the vertical of the MBE apparatus 350.

A rotating shaft of the substrate holder 302 is arranged inclinedly to form an angle of 65° to the vertical.

In this example, the crucible 150 is so constructed that it can be divided into two at the joint 151. However, the crucible 150 may be so constructed that it can be divided, for example, at two joints into three parts, that is, the material accommodating section 103, the bent portion 108 and the molecular beam shape defining section 102 including the narrowed portion 104.

With the molecular beam source cell 250 of Example 2, since the crucible 150 is dividable, a molecular beam generating material 103 can be fed in the material accommodating section 103 from the joint 151 of the material accommodating section 103 as an inlet opening. For this reason, the shape of the material to be fed is not limited by the inner diameter of the narrowed portion 104. The size of the material to be fed can be increased to reduce its surface area, which suppresses outgasing from the material.

Further, in the case where the molecular beam source cell is attached to a cell port forming an angle of 40° with respect to the vertical of the MBE apparatus 350, the crucible 903 of the conventional structure shown in FIG. 13 can accommodate only 70 cc of the material, while the molecular beam source cell 250 of Example 2 can accommodate about 300 cc of the material, which is about 4.3 times larger. Thus, the material feeding cycle can be extended three times or more, which reduce the product costs to three-fourths or less.

Comparative Example 1

Figure 7:
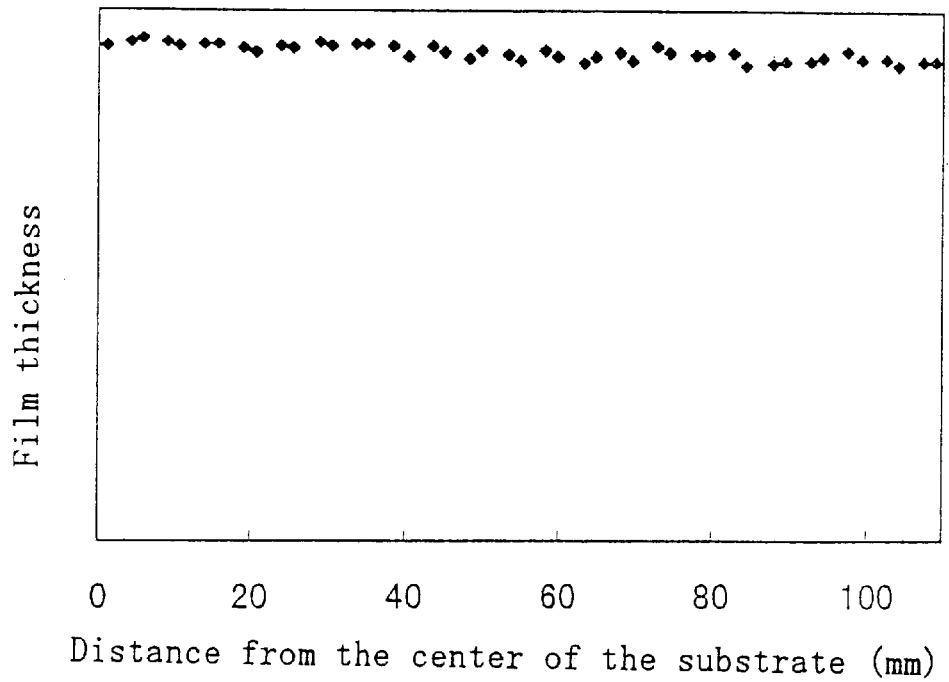
FIG. 7 is a graph representing distribution of thickness in a thin film formed on a substrate by a molecular beam source in accordance with Example 1 of the present invention.
Figure 8:
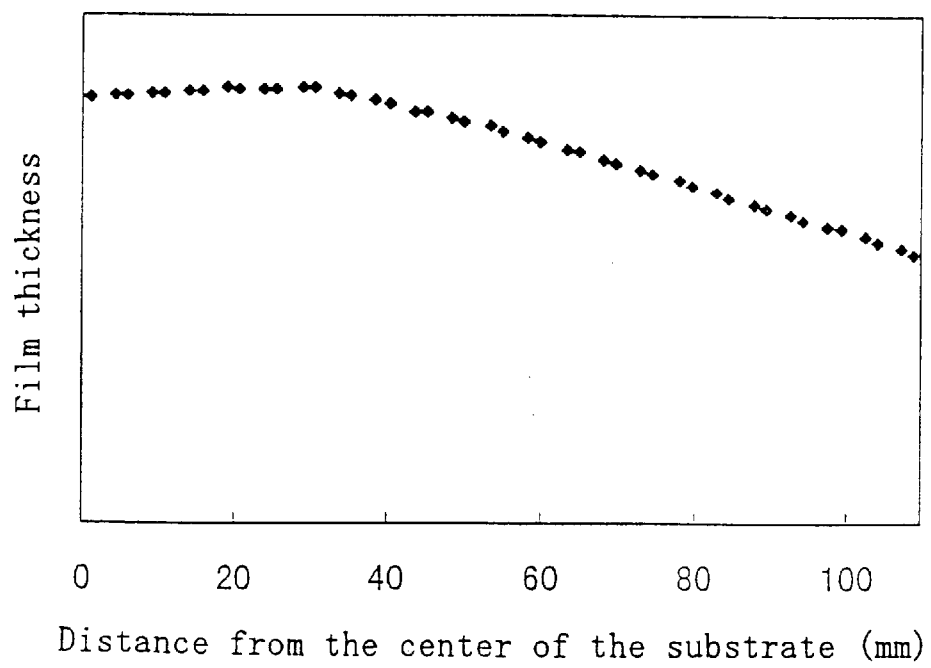
FIG. 8 is a graph representing distribution of thickness in a thin film formed on a substrate by the molecular beam source of FIG. 14.

FIG. 7 and FIG. 8 show an example of comparison of measurement results of film thickness distribution on the surfaces of substrates when crystals were grown on the substrates supported by the substrate holder 302 of the above-described MBE apparatus 300.

FIG. 7 represents the case where the crucible 100 of Example 1 was attached to a horizontal port of the MBE apparatus 300, and FIG. 8 represents the case where the crucible 910 of the conventional structure was attached to the horizontal port of the MBE apparatus 300 in place of the crucible 100.

As shown in FIG. 7, with the crucible 100 of Example 1 having the narrowed portion 104 in the molecular beam shape defining section 102, the obtained film showed a thickness distribution of ±2% within a range of 110 mm radius from the center of the substrate. By contrast, with the conventional crucible 910, the obtained film showed a thickness distribution of ±2% within a range of 30 mm radius from the center of the substrate, but the thickness decreases sharply outside the 30 mm radius range.

Figure 14:
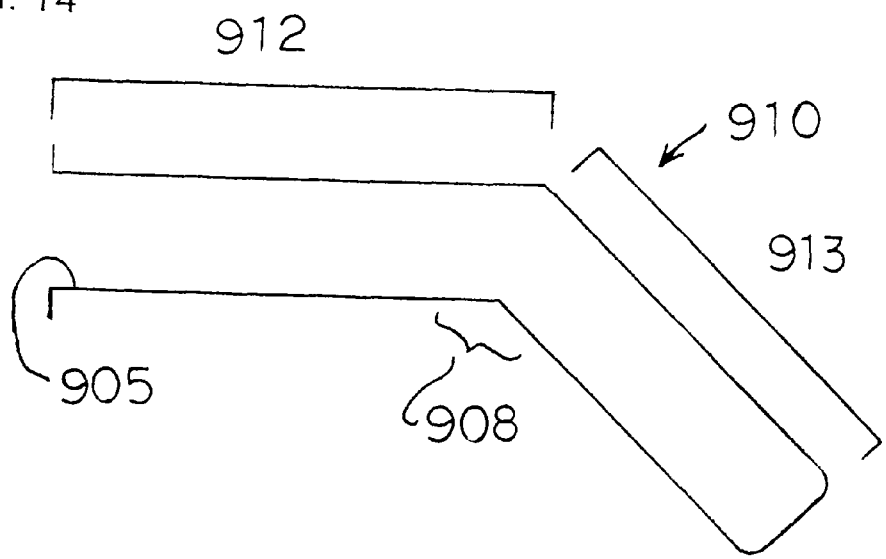
FIG. 14 is a schematic sectional view illustrating the construction of a conventional crucible having a bent portion.

That is, with the crucible 100 of Example 1, the molecular beams emitted from the opening 105 have a broadened shape, i.e., are radially irradiated, owing to a diffusing effect of the narrowed portion 104. On the other hand, with the conventional crucible 910 (shown in FIG. 14) with the molecular beam shape defining section 912 formed of a parallel tube, the molecular beams emitted from the opening 905 has s tight shape. Therefore, the conventional crucible 910, if used in an laboratory-use MBE apparatus for small substrates, is an effective means because the molecular beam generating material is gathered in a central part of the substrate. However, it is not suitable for an MBE apparatus for mass production because, if it is used for producing large substrates, uniform film thickness cannot be obtained on the entire surfaces of the substrates including peripheral parts.

Comparative Example 2

Figure 9:
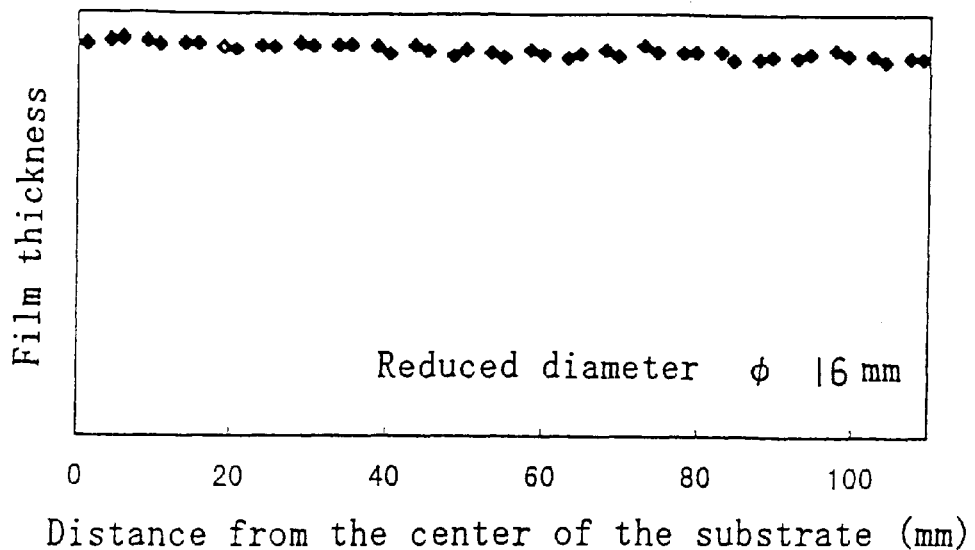
FIG. 9 is a graph representing distribution of thickness in a thin film formed on a substrate by another molecular beam source in accordance with Example 1 of the present invention.
Figure 10:
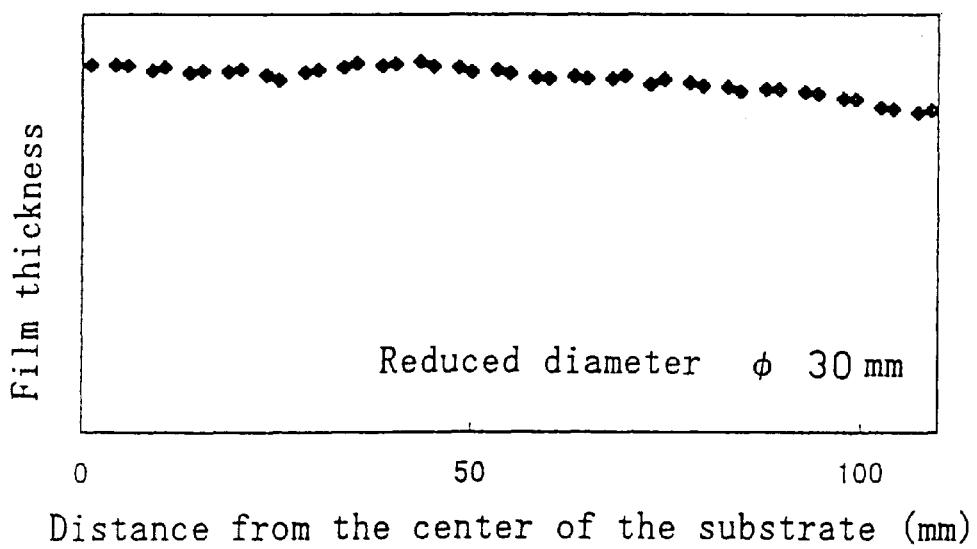
FIG. 10 is a graph representing distribution of thickness in a thin film formed on a substrate by another molecular beam source in accordance with Example 1 of the present invention.

FIG. 9 and FIG. 10 show measurement results of film thickness distribution on the surfaces of substrates when crystals were grown on the substrates supported by the substrate holder 302 as in Comparative Example 1 but with use of crucibles 100 having reduced different (inner) diameters at their respective narrowed portions 104. The crucibles were attached to the horizontal port of the MBE apparatus.

FIG. 9 shows the case where the reduced diameter was 16 mm and FIG. 10 shows the case where the reduced diameter was 30 mm. See for reference the above-mentioned FIG. 8 showing the case where the crucible 910 of the conventional construction without the narrowed portion 104 was attached to the horizontal port.

As shown in FIG. 9, with the crucible 100 having the narrowed portion 104 of 16 mm inner diameter in its molecular beam shape defining section 102, the obtained film showed a thickness distribution of ±2% within a range of 110 mm radius from the center of the substrate.

As shown in FIG. 10, with the crucible 100 having the narrowed portion 104 of 30 mm inner diameter in its molecular beam shape defining section 102, the obtained film showed a uniform thickness distribution within a range of about 70 mm radius from the center of the substrate, though the uniformity of the film thickness was somewhat poorer.

By contrast, as shown in FIG. 8, with the conventional crucible 910, the obtained film showed a thickness distribution of ±2% within a range of 30 mm radius from the center of the substrate, but the thickness decreases sharply outside the 30 mm radius range.

As clearly understood from Comparative Examples 1 and 2, the diffusion effect of the narrowed portion 104 is ensured more positively by setting the reduced diameter of the narrowed portion 104 suitably for the size of a substrate.

The molecular beam source of the present invention is provided with the crucible which is so bent that the molecular beam generating material accommodated therein does not face the opening directly, that is, the molecular beam generating material accommodated in the bottom portion of the crucible is not seen from the opening, and which has, between the bent portion and the opening, the narrowed portion whose cross-sectional area is reduced. Therefore, a melt-type molecular beam generating material can be used, and the molecular beam generating material, if boils suddenly, is prevented from scattering toward the opening. Further, it is ensured that a sufficient amount of the molecular beam generating material is fed, and also the molecular beams emitted from the opening of the crucible can be diffused radially. Thus, a uniform film thickness can be obtained on large substrates.

Since the crucible is bent so that the molecular beam generating material in the material accommodating section is not seen from the opening, the molecular beam generating material can be fed in a sufficient amount even if the molecular beam source cell is attached to an almost horizontal cell port of an MBE apparatus. Also, the molecular beam generating material fed in the material accommodating section, if it scatters owing to its sudden boiling, does not reach the substrate directly. Thus can be significantly reduced defects which would otherwise be caused be the sudden boiling.

Furthermore, by constructing the crucible so that it can be separated into two or more parts, it becomes possible to give the crucible a complicated shape, the molecular beam generating material can be fed in the crucible with increased ease, and the degree of freedom in the shape of the molecular beam generating material is improved.

According to the present invention, can be provided a molecular beam source and a molecular beam epitaxy apparatus whose crucible can receive a large amount of the molecular beam generating material and which can provide a uniform film thickness even on a large substrate.

What is claimed is:

1. A molecular beam source comprising:

a crucible having an opening, and a heater mounted to the crucible for evaporating by heating a molecular beam generating material accommodated in the crucible to emit a molecular beam from the opening, wherein the crucible has an accommodating section for accommodating the molecular beam generating material, a bent portion provided between the opening and the accommodating section so that the molecular beam generating material accommodated in the accommodating section does not face the opening directly, and a narrowed portion between the bent portion and the opening.

2. A molecular beam source according to claim 1, wherein the narrowed portion has an inner diameter of 1/20 to 1/2 of the maximum diameter in a part of the crucible from the opening to the bent portion.

3. A molecular beam source according to claim 1 or 2, wherein the crucible has a substantially conical shape from the opening to the narrowed portion.

4. A molecular beam source according to claim 1, wherein the crucible comprises at least two members which are connectable at a position closer to the bent portion than to the narrowed portion.

5. A molecular beam source according to claim 4, wherein said at least two members have a pair of joints which are capable of being friction-fitted.

6. A molecular beam source according to claim 1, wherein the heater comprises resistance heating elements provided in the vicinity of the opening and in the vicinity of the accommodating section, and the density of the resistance heating element provided in the vicinity of the opening is greater than that of the resistance heating element provided in the vicinity of the accommodating section.

7. A molecular beam epitaxy apparatus comprising:

a molecular beam source as set forth in claim 1;

a vacuum chamber for supporting the molecular beam source;

a shroud provided along an inner wall of the vacuum chamber; and a substrate holder provided in the shroud opposedly to the opening of the crucible of the molecular beam source.

* * * * *